(12) United States Patent
McCullough

(10) Patent No.: US 6,817,096 B2
(45) Date of Patent: Nov. 16, 2004

(54) METHOD OF MANUFACTURING A HEAT PIPE CONSTRUCTION

(75) Inventor: Kevin A. McCullough, Warwick, RI (US)

(73) Assignee: Cool Options, Inc., Warwick, RI (US)

( * ) Notice: Subject to any disclaimer, the term of this patent is extended or adjusted under 35 U.S.C. 154(b) by 0 days.

(21) Appl. No.: 09/756,821

(22) Filed: Jan. 9, 2001

(65) Prior Publication Data

US 2001/0047590 A1 Dec. 6, 2001

Related U.S. Application Data

(60) Provisional application No. 60/175,437, filed on Jan. 11, 2000.

(51) Int. Cl.[7] .............................................. B23P 15/20
(52) U.S. Cl. ............................... 29/890.032; 29/890.03
(58) Field of Search ........................ 29/890.032, 890.03; 165/185, 104.21, 104.22, 104.33; 264/101, 102, 150, 232, 238, 271.1, 275; 164/98, 112

(56) References Cited

U.S. PATENT DOCUMENTS

| | | | | |
|---|---|---|---|---|
| 4,087,893 A | * | 5/1978 | Sata et al. .............. | 165/104.21 |
| 4,372,377 A | * | 2/1983 | Morris .................... | 165/104.26 |
| 4,398,703 A | * | 8/1983 | Elderfield ................ | 165/47 |
| 4,461,343 A | * | 7/1984 | Token et al. ........... | 165/104.26 |
| 4,793,404 A | * | 12/1988 | Hata ...................... | 138/140 |
| 4,901,415 A | * | 2/1990 | Hata ...................... | 29/424 |
| 6,050,331 A | * | 4/2000 | Breault et al. .............. | 165/168 |
| 6,085,830 A | * | 7/2000 | Mashiko et al. ........... | 165/80.3 |
| 6,237,223 B1 | * | 5/2001 | McCullough .......... | 29/890.032 |
| 6,251,978 B1 | * | 6/2001 | McCullough ............... | 524/404 |
| 6,253,829 B1 | * | 7/2001 | Mashiko et al. ............ | 164/109 |
| 6,321,452 B1 | * | 11/2001 | Lin ........................ | 29/890.03 |
| 6,367,541 B2 | * | 4/2002 | McCullough .............. | 165/80.3 |
| 6,385,047 B1 | * | 5/2002 | McCullough et al. ....... | 361/704 |
| 6,397,941 B1 | * | 6/2002 | McCullough ............... | 165/185 |
| 6,478,997 B2 | * | 11/2002 | McCullough ............... | 264/108 |
| 6,487,073 B2 | * | 11/2002 | McCullough et al. ....... | 361/687 |

* cited by examiner

Primary Examiner—Irene Cuda Rosenbaum
(74) Attorney, Agent, or Firm—Barlow, Josephs & Holmes, Ltd.

(57) ABSTRACT

A method of manufacturing a heat pipe construction includes first providing a tubular pipe with an open end. A thermally conductive material, such as a metallic material or a filled polymer composite material is overmolded over or cast around the tubular pipe. Additional heat dissipating elements, such as insert molded pins, may be provided in the overmolded or cast material to enhance thermal conductivity of the heat sink assembly. The tubular pipe is then filled with heat pipe media, such as water or ammonia, and then immediately sealed therein to effectively form an embedded heat pipe within a thermally conductive cast or overmolded structure. With the method of the present invention, an heat pipes can be overmolded with or cast into other heat dissipating material structure to improve overall performance of the heat pipe without damaging the heat pipe.

4 Claims, 1 Drawing Sheet

METHOD OF MANUFACTURING A HEAT PIPE CONSTRUCTION

This application claims benefit of No. 60/175,4437 filed Jan. 11, 2000.

BACKGROUND OF THE INVENTION

The present invention relates generally to the cooling of heat generating surfaces and objects. More specifically, the present invention relates to a method of manufacturing a heat pipe construction for dissipating heat generated by such objects. In addition, the present invention relates to cooling of heat generating objects passively by use of a phase-change media within a heat pipe construction without the use of external fans or devices to assist in cooling.

In industry, there are various parts and components that generate heat during operation. For example, in the electronics and computer industries, it is well known that computer components generate heat during operation. Various types of electronic device packages and integrated circuit chips, such as the PENTIUM central processing unit chip (CPU) manufactured by Intel Corporation and RAM (random access memory) chips are such devices that generate heat. These integrated circuit devices, particularly the CPU microprocessor chips, generate a great deal of heat during operation which must be removed to prevent adverse effects on operation of the system into which the device is installed. For example, a PENTIUM microprocessor, containing millions of transistors, is highly susceptible to overheating which could destroy the microprocessor device itself or other components proximal to the microprocessor.

There are a number of prior art methods to cool heat generating components and objects to avoid device failure and overheating, as discussed above. A block heat sink or heat spreader is commonly placed into communication with the heat generating surface of the object to dissipate the heat therefrom. Such a heat sink typically includes a base member with a number of individual cooling members, such as fins, posts or pins, to assist in the dissipation of heat. The geometry of the cooling members is design to improve the surface area of the heat sink with the ambient air for optimal heat dissipation. The use of such fins, posts of pins in an optimal geometrical configuration greatly enhances heat dissipation compared to devices with no such additional cooling members, such as a flat heat spreader.

To further enhance air flow and resultant heat dissipation, fans and devices have been used, either internally or externally. However, these external devices consume power and have numerous moving parts. As a result, heat sink assemblies with active devices are subject to failure and are much less reliable than a device which is solely passive in nature.

It has been discovered that more efficient cooling of electronics can be obtained through the use of passive heat pipes which require no external power source and contain no moving parts. Generally, the heat pipe is in the form a vacuum-tight vessel in a particular geometric shape which is evacuated and partially filled with a working fluid. The heat pipe passively transfers heat from a heat source to a heat sink where heat is dissipated. As the heat is conducted into the heat pipe, the fluid is vaporized in an evaporator section creating a pressure gradient in the heat pipe. This forces the vapor to flow along the heat pipe to the condenser section, where the vaporized fluid is condensed and turned back to its fluid state by giving up its latent heat of vaporization. The working fluid is then returned to the evaporator section to repeat the process of removing the heat generated by the heat source. One method used to achieve cooling by use of a heat pipe places the evaporator section at the lower end and the condenser section at the upper end where the heat pipe is in a substantially vertical position. Once the working fluid has been condensed, the liquid flows by gravity back to the evaporator section. Internal wick structures may be used to assist liquid flow back to the evaporator section by capillary action to reduce the effect of gravity on the device.

Alternatively, the heat pipe may be simply filled with the working fluid to create a vapor chamber therein when the liquid is heated by the heat generating object. It is well known in the prior art that vaporized water or ammonia is highly thermally conductive and greatly facilitates the transfer of heat.

Heat pipes alone are know devices for use in dissipating heat from a heat generating object. However, heat pipes are typically tubular in configuration and do not interface well with objects to be cooled. Further, heat pipes, due to their tubular configuration, do not interface well with the ambient air for dissipation of heat. For example, a typical heat pipe may only be a few centimeters in diameter while the object to be cooled may be a microprocessor which is two inches square in shape. As a result, the affixation of such a heat pipe to a microprocessor results in a very inefficient transfer of heat from such a large heat generating surface to a small surface area about one side of the diameter of a heat pipe. Further, the exposure of the free end, not connected to a heat generating object, to the ambient air is also inefficient because the surface area of the diameter of the heat pipe is relatively small thus making the dissipation of heat even more inefficient.

While is desirable to cast a heat sink assembly or overmold a thermally conductive configuration about a heat pipe, there is a serious risk of damage to the heat pipe during the casting or molding process. If the tubular pipe is cracked or split during formation of the heat sink configuration, the heat pipe media will leak and the heat pipe will not operate properly resulting in a deleterious effect on the thermal conductivity of the overall heat dissipation device.

In view of the foregoing, there is a demand for a heat pipe construction and a method for manufacturing such a construction that is less expensive than the prior art yet provides superior heat dissipation. There is a demand for a passive heat pipe construction with no moving parts that can provide heat dissipation without the use of active components. In addition, there is a demand for a method of manufacturing a heat pipe construction that enables additional heat dissipating material to be cast or mold around a heat pipe without risk of damage to the heat pipe itself.

SUMMARY OF THE INVENTION

The present invention preserves the advantages of prior art heat dissipation, heat exchanger devices and heat pipes. In addition, it provides new advantages not found in currently available devices and overcomes many disadvantages of such currently available devices.

The invention is generally directed to a method of manufacturing a heat pipe construction. A tubular pipe is first provided with an open end. A thermally conductive material, such as a metallic material or a filled polymer composite material is overmolded over or cast around the tubular pipe. Additional heat dissipating elements, such as insert molded pins, may be provided in the overmolded or cast material to enhance thermal conductivity of the heat sink assembly. The tubular pipe is then filled with heat pipe media, such as water or ammonia, and then immediately sealed therein to effectively form an embedded heat pipe within a thermally conductive cast or overmolded structure. With the method of the present invention, an heat pipes can be overmolded with or cast into other heat dissipating material structure to improve overall performance of the heat pipe without damaging the heat pipe.

It is therefore an object of the present invention to provide a method for manufacturing a heat pipe construction that enables auxiliary heat dissipating structures to be provided about the heat pipe without damaging the heat pipe itself.

It is an object of the present invention to provide a method for manufacturing a heat pipe construction that has improved overall thermal conductivity over prior art heat pipe constructions.

It is a further object of the present invention to provide a method for manufacturing a heat pipe construction that can accommodate auxiliary heat dissipating structures that have complex geometries to improve thermal conductivity the heat pipe construction.

BRIEF DESCRIPTION OF THE DRAWINGS

The novel features which are characteristic of the present invention are set forth in the appended claims. However, the inventions preferred embodiments, together with further objects and attendant advantages, will be best understood by reference to the following detailed description taken in connection with the accompanying drawings in which:

DETAILED DESCRIPTION OF THE PREFERRED EMBODIMENT

Figure 1:
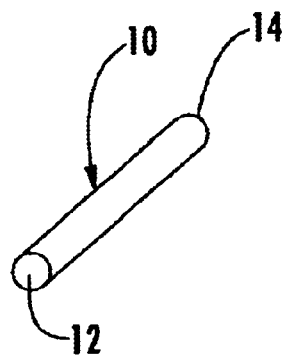
FIG. 1 is a perspective view of a tubular pipe used in the method of manufacturing a heat pipe construction in accordance with the present invention.

As shown in FIG. 1 and in accordance with the method of manufacturing a heat pipe construction of the present invention, a tubular pipe 10, also referred to as the heat pipe, is provided. The tubular pipe is preferably made of metal, such as aluminum or copper. Other suitable materials for heat pipes, which are know in the art, may be employed in the present method. The tubular pipe 10 is shown in FIG. 1 as a straight substantially cylindrical configuration; however, other shapes and configurations may be employed, such as a flattened U-shaped tubular pipe, and still be within the scope of the present invention. This tubular pipe 10 is capable of retaining heat pipe media, such as water or ammonia, as will be discussed in detail below. In the preferred embodiment of the method of the present invention, a tubular pipe 10 is shown to include two opposing open ends 12 and 14. Alternatively, one end may be closed while leaving the opposing end open.

Figure 2:
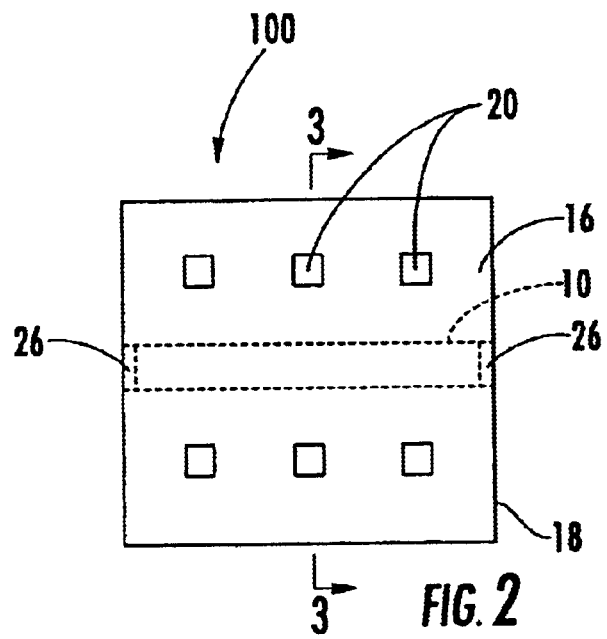
FIG. 2 is a top view of a completed heat pipe construction manufactured in accordance with the method of the present invention.
Figure 3:
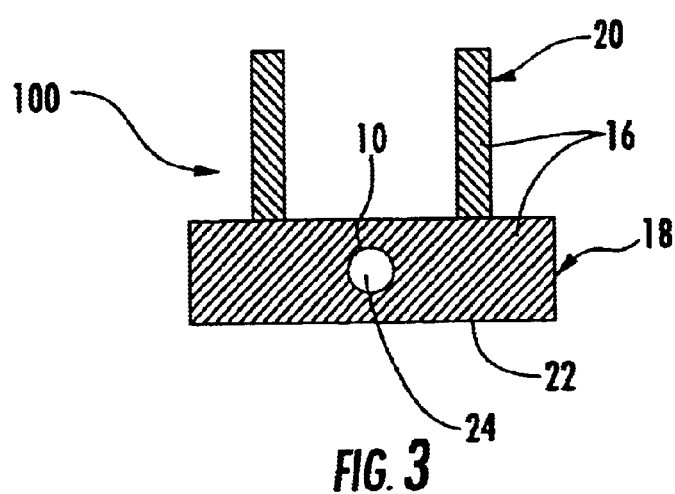
FIG. 3 is a cross-section view through the line 3—3 of FIG. 2 illustrating the heat pipe construction in accordance with the method of the present invention.

As stated above, the prior art devices provide a completed and charged heat pipe for the transfer of heat and the dissipation thereof. In accordance with the method of the present invention, an improved interface is provided between the heat pipe 10 itself and the object to be cooled and the ambient air. As shown in FIGS. 2 and 3, a thermally conductive material 16 is either cast over of molded over the heat pipe 10. This thermally conductive material 16 provides an interface with the object to be cooled (not shown), that has not been provided in the prior art. In the example shown in FIGS. 2 and 3, a base plate 18 is formed around the heat pipe 10. Preferably, an array of heat dissipating pins 20 are also formed as emanating from or embedded within the base plate 18, such as by insert molding. The pin array 20 may be integrally formed with the base plate 18 or may be separate members, such as metal pins. As best seen in FIG. 3, a cross-sectional view through the line 3—3 of FIG. 2, an enlarged bottom contact surface 22 is now provided to interface and thermally communicate with an object to be cooled. Further, the upstanding pin array 20 provides additional surface area of thermally conductive material 16 and, as a result, enhances heat dissipation into the ambient air. As can be understood, this overmolded or cast heat sink configuration 18, 20 greatly improves the overall heat dissipating performance of the heat pipe 10.

However, molding or casting around a delicate heat pipe 10 imparts significant pressure to the heat pipe 10 making it susceptible to damage during this operation. As stated above, if the heat pipe 10 is cracked or split during molding or casting of the heat sink configuration 18, 20, the heat pipe media 24, contained within the heat pipe 10 will leak from the structure resulting in degradation of the performance of the heat pipe construction, generally referred to as 100. Therefore, in accordance with the present invention, an empty heat pipe 10, with at least one open end 12 or 14, is overmolded with the desired thermally conductive composition 16 or appropriate heat sink configuration 18, 20 with base 18 and pins 20 cast around the empty heat tubular pipe 10. For example, as shown in FIG. 2, a tubular pipe 10 is provided with the two open ends 12, 14. The outer heat sink configuration 18, 20 is formed around the empty tubular pipe 10 leaving the open ends 12, 14 free of thermally conductive material. During the casting or molding process, in accordance with the present invention, the tubular pipe 10 is free to flex or compress slightly during the casting or overmolding process. If the tubular pipe 10 was already charged during this casting or molding processing, it would likely burst or crack rendering the embedded heat pipe 10 inoperable.

After formation of the heat sink configuration 18, 20, the tubular pipe 10 is charged with the desired heat pipe media 24, such as water or ammonia. Since the casting or molding process has already been completed, there is no concern that the there will be further damage to the heat pipe 10. In the example shown in FIG. 2, opposing ends of the tubular pipe 10 are sealed with plugs 26 after the tubular pipe 10 has been charged. Various apparatuses, that are known in the prior art, are capable of creating a vacuum in the tubular pipe, charging it and sealing it as set forth in the method of the present invention.

Therefore, the method of the present invention enables a heat pipe construction 100 to be manufactured where a heat pipe 10 is embedded within a heat sink configuration 18, 20 formed therearound. This desirable structure can be achieved without risk of damage to the embedded heat pipe 10.

It would be appreciated by those skilled in the art that various changes and modifications can be made to the illustrated embodiments without departing from the spirit of the present invention. All such modifications and changes are intended to be covered by the appended claims.

What is claimed is:

1. A method of manufacturing a heat pipe construction, comprising, in order, the steps of:

(1) providing a tubular pipe having at least one open end;
   (2) overmolding a thermally conductive filled polymer composition around said tubular pipe to form a base plate;
   (3) mounting separate heat-dissipating pin members on the surface of the base plate;
   (4) filling said tubular pipe with heat pipe media via said at least one open end; and
   (5) closing said at least one end with said heat pipe media sealed therein.

2. The method of claim 1, wherein said step of providing a tubular pipe comprises providing a tubular pipe manufactured of metal.

3. The method of claim 1, wherein said step of filling said tubular pipe with heat pipe media comprises filling said tubular pipe with water.

4. The method of claim 1, wherein said step of filling said tubular pipe with heat pipe media comprises filling said tubular pipe with ammonia.

\* \* \* \* \*